United States Patent [19]
Thenoz et al.

[11] Patent Number: 5,698,886
[45] Date of Patent: Dec. 16, 1997

[54] PROTECTION CIRCUIT AGAINST ELECTROSTATIC DISCHARGES

[75] Inventors: Yves Thenoz, Quaix-en-Chartreuse; Sophie Caranhac, Grenoble; Jean-Louis Coutures, St Egreve, all of France

[73] Assignee: Thomson-CSF Semiconducteurs Specifiques, Paris, France

[21] Appl. No.: 510,667

[22] Filed: Aug. 3, 1995

[30] Foreign Application Priority Data

Aug. 19, 1994 [FR] France .................. 94 10152

[51] Int. Cl.$^6$ .................................... H01L 23/62
[52] U.S. Cl. .................. 257/355; 257/357; 257/360; 257/365; 257/173; 257/174; 257/363; 257/546
[58] Field of Search ................ 257/173, 174, 257/328, 355–63, 546

[56] References Cited

FOREIGN PATENT DOCUMENTS 0 549 320 A1  6/1993  European Pat. Off. .

OTHER PUBLICATIONS

Proceedings of the IEEE Custom Integrated Circuits Conference, May 1988, pp. 27.2.1–27.2.4, May 1988, Author: Q. Say.

Proceedings of the IEEE 1988 Custom Integrated Circuits Conference, "Resistorless ESD Protection Device for High Speed CMOS Circuits", Q. Say. New York, USA, May 1988, pp. 27.2.1–27.2.4.

Patent Abstracts Of Japan, vol. 4, No. 165 (E–034), 15 Nov. 1980, and JP-A-55 113 359 (Fujitsu) 1 Sep. 1980.

*Primary Examiner*—Edward Wojciechowicz
*Attorney, Agent, or Firm*—Oblon, Spivak, McClelland, Maier & Neustadt, P.C.

[57] ABSTRACT

A protection circuit against the electrostatic discharges that could appear at the terminals of a circuit, wherein said protection circuit comprises a first transistor made in a well whose potential is a floating potential and enabling the value of the discharge voltage to be limited to a value equal to minus the value of the threshold voltage of said first transistor and a second transistor made in a well whose potential is a floating potential and enabling the value of the discharge voltage to be limited to a value equal to the value of the threshold voltage of said second transistor. The disclosure can be applied to MOS technology integrated circuits.

10 Claims, 2 Drawing Sheets

PROTECTION CIRCUIT AGAINST ELECTROSTATIC DISCHARGES

BACKGROUND OF THE INVENTION

1. Field of the Invention

The present invention relates to a protection circuit against electrostatic discharges.

Such protection circuits are present, for example, in MOS (metal oxide semiconductor) technology integrated circuits.

As is known to those skilled in the art, the low-thickness gate insulator of the MOS transistors can become suddenly conductive when the electrical field applied to it exceeds a certain value called a breakdown value. This results in a degree of deterioration that could cause even the destruction of the transistors. Protection transistors are therefore designed to avert this phenomenon.

2. Description of the Prior Art

In the prior art, protection circuits are of different types.

Certain protection circuits protect only circuits working either with a positive bias voltage or with a negative bias voltage. In this case, the biased circuits cannot be protected by means of positive and negative voltages.

Other devices enable a protection of circuits working with positive and negative bias voltages. Some of these circuits are highly complex. It may then be necessary to form N wells in a P substrate or, conversely, P wells in an N substrate. One drawback then is that these wells need to be biased.

Other circuits have a less complex structure and enable the biasing of the wells to be avoided. The equivalent diagram of these circuits comprises two diodes mounted back to front with respect to each other. A first diode is formed, for example, by a P+ zone in an N well and a second diode by the junction then formed by the N well and the P substrate.

It is the breakdown of the diodes by avalanche effect that makes it possible to limit the discharge voltages liable to cause deterioration in the circuits. The breakdown voltage of the diode formed by the junction of the N well with the P substrate is relatively high, for example in the range of 100 volts. The discharge voltage has to be limited to voltages in a lower range of values, for example to voltages of the order of 15 to 20 volts. As is known to those skilled in the art, the breakdown voltage is then adjusted by barrier rings, for example N+ barrier rings, formed by overdoping on the surface of the component. It follows therefrom that the breakdown takes place also on the surface. This type of protection is generally ineffective in discharging the currents due to the electrostatic discharges. It is furthermore sensitive to ageing. As and when successive instances of breakdown occur, the diode deteriorates and the breakdown voltage undergoes changes.

The present invention does not show these drawbacks.

SUMMARY OF THE INVENTION

An object of the present invention is a protection circuit against the electrostatic discharges that could appear at the terminals of a circuit, wherein said protection circuit comprises a first transistor made in a well whose potential is a floating potential, said first transistor enabling the value of the discharge voltage to be limited to a value equal to minus the value of its threshold voltage and a second transistor made in a well whose potential is a floating potential, said second transistor enabling the value of the discharge voltage to be limited to a value equal to the value of its threshold voltage.

An advantage of the invention is that it prevents the use of protection circuits such as those mentioned here above.

BRIEF DESCRIPTION OF THE INVENTION

Other characteristics and advantages of the invention shall appear from the following description of an embodiment, made with reference to the appended figures, of which:

In all the figures, the same references designate the same elements.

MORE DETAILED DESCRIPTION

In a P substrate 1, an N well 2 is formed.

According to the invention, the well 2 not connected to any external bias voltage and is therefore at a floating potential.

Figure 1:
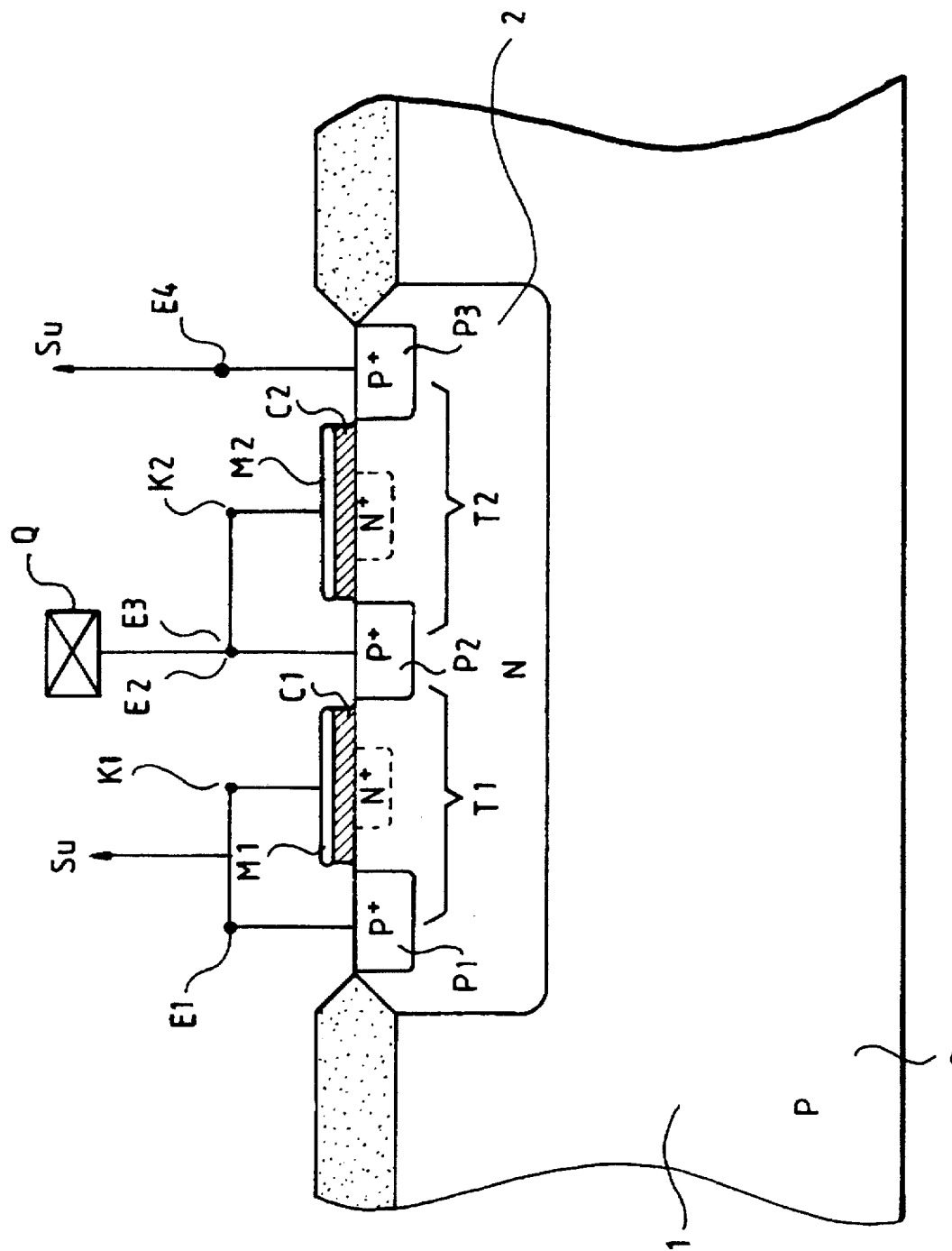
FIG. 1 shows a sectional view of a protection circuit according to a first embodiment of the invention.

Three P+ doped zones, P1, P2, P3 are created at the surface of the well 2. As shown in FIG. 1, the three zones P1, P2, P3 are preferably aligned and the zone P2 is located between the zones P1 and P3. An insulating dielectric layer C1 covers the surface of the well located between the zones P1 and P2. Similarly, an insulating dielectric layer C2 covers the surface of the well located between the zones P2 and P3. The dielectric layer C1 is covered with a conductive layer M1 and the dielectric layer C2 is covered with a conductive layer M2. It follows therefrom that, firstly, the zones P1 and P2 constitute the main electrodes of a first P MOS transistor, referenced T1, whose control electrode is constituted by the conductive layer M1 and, secondly, the zones P2 and P3 constitute the main electrodes of a second P MOS transistor, referenced T2, whose control electrode is constituted by the conductive layer M2.

The two main electrodes of the transistor T1 are referenced E1 and E2 and correspond to the respective P+ doped zones P2 and P3. The two main electrodes of the transistor T2 are referenced E3 and E4 and correspond to the respective P+ doped zones P2 and P3. The main electrodes E2 and E3 are therefore one and the same and correspond to the P+ zone referenced P2. The control electrode of the transistor T1 is referenced K1 and the control electrode of the transistor T2 is referenced K2.

As mentioned here above, each control electrode (K1, K2) is constituted by an insulating dielectric layer (C1, C2) covered with a conductive layer (M1, M2). The insulating dielectric layer may be either a thin layer made with a dielectric having a nature identical to that used to form the gates of the circuits to be protected or else by a layer of thick oxide.

In the former case, i.e. when the dielectric layer is a thin layer made with a dielectric having a nature identical to the one used for the gates of the transistors to be protected, N+ zones are implanted in the N semiconductor zones located beneath the control electrodes so as to raise the absolute value of the threshold voltages of the transistors T1 and T2. As shall be specified here below, the N+ doping is done so as to obtain, for example, threshold voltages with identical absolute values in the range of 17 volts. More generally, the invention relates, however, to other embodiments for which the values of the threshold voltages obtained are different. In order to prevent any parasitic breakdown between the P+ zones and the N+ zones, the N+ doping operations are not done in the totality of the N zones but preferably in the central part of the N zones.

In the latter case, i.e. when the insulation dielectric is a thick oxide layer, it may be unnecessary to implant an N+ zone in the zones located beneath the control electrodes. Only the modification of the thickness of the oxide layer may then enable the threshold voltage to be adjusted to the desired value.

According to the invention, the main electrode E1 and the control electrode K1 are connected together to the reference potential Su of the substrate 1, the main electrode E4 is connected to the reference potential Su of the substrate 1, and the main electrodes E2 and E3 and the control electrode K2 are connected together to the same pad Q.

The protection circuit is parallel-connected with the circuits to be protected. These circuits to be protected are therefore located between the pad Q and the reference potential Su of the substrate 1.

The transistors T1 and T2 have respective threshold voltages VT1 and VT2 with negative amplitudes. As has been mentioned here above, the values of the voltages VT1 and VT2 are adjusted either by means of the N+ doping of the N zones located beneath the insulating dielectric layers C1 and C2 or by the variation of thickness of the dielectric layers C1 and C2. For example, in the case of the N+ doping, this doping is done so as to obtain threshold voltages with preferably identical values, for example values of the order of 17 volts in terms of absolute value.

When a discharge having an amplitude V that is positive with respect to the reference potential of the substrate 1 is applied to the pad Q; the electrodes E1 and E2 behave respectively as the drain and the source of the transistor T1 and the electrodes E3 and E4 behave respectively as the source and the drain of the transistor T2. It follows therefrom that the transistor T2 is off and that the transistor T1 becomes conductive when the voltage of the electrostatic discharge reaches a value equal to minus the value of VT1.

Similarly, when a discharge with an amplitude V that is negative with respect to the reference voltage of the substrate 1 is applied to the pad Q, the electrodes E1 and E2 behave respectively as the source and the drain of the transistor T1 and the electrodes E3 and E4 behave respectively as the drain and the source of the transistor T2. It follows therefrom that the transistor T1 is off and that the transistor T2 becomes conductive when the voltage of the electrostatic discharge reaches the value of the threshold voltage VT2.

Figure 2:
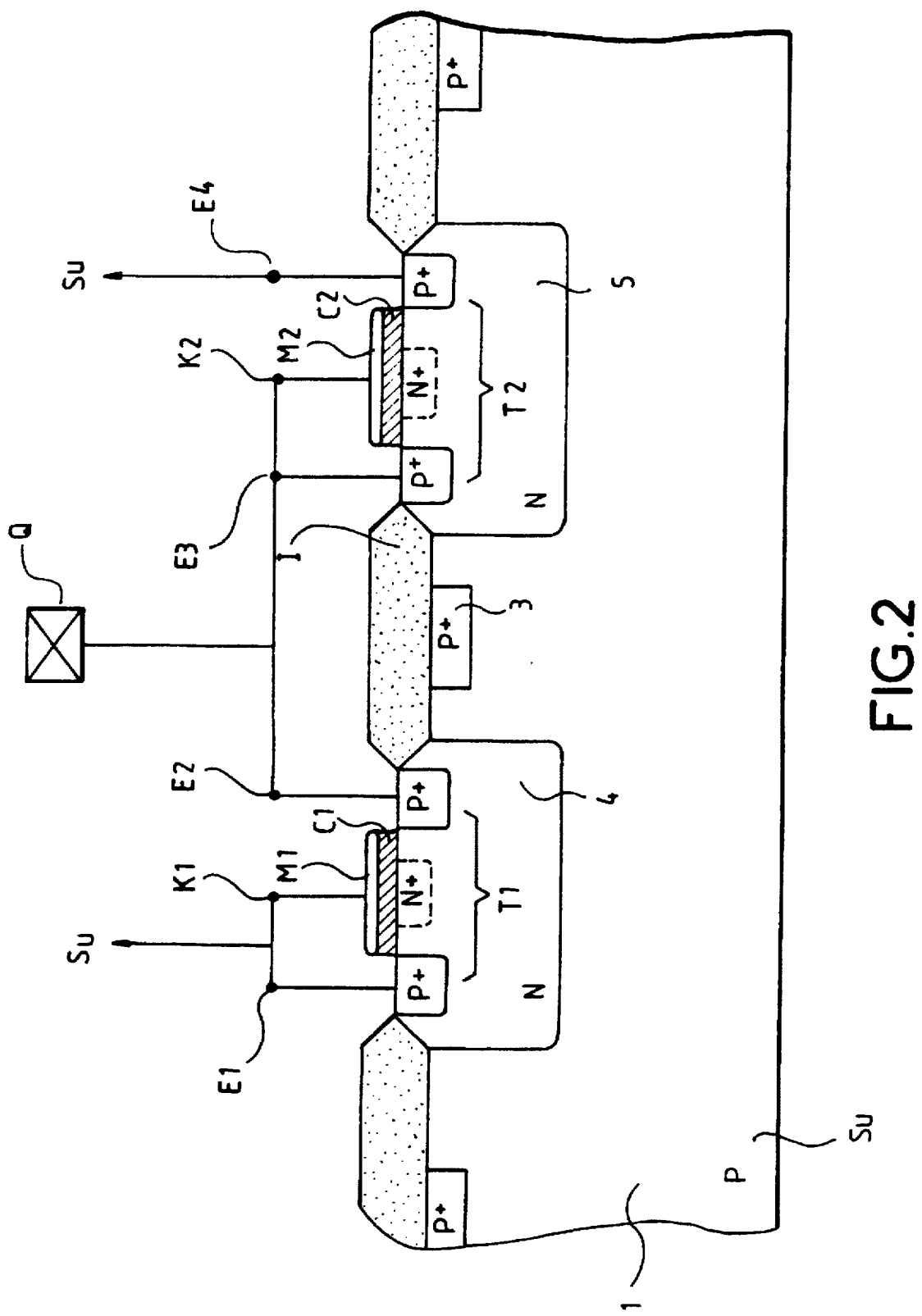
FIG. 2 shows a sectional view of a protection circuit according to a second embodiment of the invention.

FIG. 2 shows a sectional view of a protection circuit according to a second embodiment of the invention.

According to this embodiment, the P+ zone which defines the main electrode E2 of the transistor is distinct from the zone P+ which defines the main electrode E3 of the transistor T2. The transistors T1 and T2 are then made in different wells, respectively referenced 4 and 5 in FIG. 2. According to the invention, these wells are not connected to any external bias voltage and are therefore at floating potentials. The electrodes E2 and E3 are however still connected to each other and to the same pad Q. The separation of the two P+ zones is then achieved by an insulator zone I providing insulation by thick oxide. A zone P+ zone, referenced 3 in FIG. 2, is implanted in the P substrate, beneath the thick oxide region I. This zone contributes to the insulation of the wells 4 and 5, in which the respective transistors T1 and T2 are formed, especially in preventing the formation of a parasitic channel between the wells 4 and 5.

As shown in FIG. 2, the P+ zones are implanted generally beneath all the thick oxide insulation zones of the circuit. These zones have not been shown in FIG. 1 for reasons of convenience.

An advantage of the invention is that it enables the protection of the circuits by the placing of the MOS transistors in a conductive state and not by the diode avalanche phenomenon. The efficiency of the protection is thereby greatly improved as is the reliability of the component.

Another advantage of the invention is that it enables the protection of circuits not only in the presence of positive and/or negative bias voltages of the circuits to be protected but also in the absence of any external bias voltage.

According to the two embodiments of the invention described here above, the protection MOS transistors T1 and T2 are induced P channel transistors made in an N well within a P substrate. The invention however also relates to induced N channel protection MOS transistors made in a P well within an N substrate.

What is claimed is:

1. A protection circuit for protecting against electrostatic discharges appearing at terminals of a device circuit, said protection circuit being an integrated circuit which comprises:

a first transistor made in a first portion of a well whose potential is a floating potential with respect to a substrate in which said well is formed, said first transistor having a first threshold voltage and said first transistor enabling a value of a discharge voltage to be limited to minus a value of said first threshold voltage; and a second transistor made in a second portion of said well whose potential is a floating potential, said second transistor having a second threshold voltage wherein said second transistor enables the value of the discharge voltage to be limited to a value equal to a value of said second threshold voltage; and wherein said first and second transistors are MOS transistors each comprising two main electrodes and one respective control electrode, said first transistor having a first main electrode connected to its respective control electrode and to a first terminal of the device circuit to be protected and said first transistor further including a second main electrode connected to a second terminal of said device circuit to be protected, and said second transistor having a first main electrode connected to its respective control electrode and to said second terminal of said device circuit and said second transistor further having a second main terminal connected to said first terminal of said device circuit.

2. A protection circuit for protecting against electrostatic discharges appearing at terminals of a device circuit, said protection circuit being an integrated circuit which comprises:

a first transistor made in a first well whose potential is a floating potential, said first transistor having a first threshold voltage and said first transistor enabling a value of a discharge voltage to be limited to minus a value of said threshold voltage; and a second transistor made in a second well, said first and second wells being formed in one and the same substrate and being separated by a thick oxide insulation zone, wherein said second well has a potential which is a floating potential, said second transistor having a second threshold voltage wherein said second transistor enables the value of the discharge voltage to be limited to a value equal to a value of said second threshold voltage; and wherein said first and second transistors are MOS transistors each comprising two main electrodes and one respective control electrode, said first transistor having a first main electrode connected to its respective control electrode and to a first terminal of the device circuit to be protected and said first transistor further including a second main electrode connected to a second terminal of said device circuit to be protected, and said second transistor having a first main electrode connected to its respective control electrode and to said second terminal of said device circuit and said second transistor having a second main terminal connected to said first terminal of said device circuit.

3. A protection circuit according to claims 1, wherein said first terminal is electrically connected to said substrate.

4. A protection circuit according to claim 1 or 2, wherein said second main electrode of said first transistor is the same as said first main electrode of said second transistor.

5. A protection circuit according to claim 2, wherein said first terminal is electrically connected to said same substrate.

6. A protection circuit according to any of the claims 1 or 2, wherein the dielectric layers of the control electrodes of said first and second transistors are made with a dielectric having a nature identical to the one used to make the gates of the circuits to be protected.

7. A protection circuit according to claim 6, wherein the semiconductive central regions located beneath said dielectric layers are overdoped so as to raise the absolute value of the threshold voltage of said first and second transistors.

8. A protection circuit according to one of the claims 1 or 2, wherein the dielectric layers of the control electrodes of said first and second transistors are formed by a thick oxide layer.

9. A protection circuit according to any of the claims 1 or 2, wherein said first and second transistors are P type MOS transistors.

10. A protection circuit according to any of the claims 1 or 2, wherein the first and second transistors are N type MOS transistors.

* * * * *